US006463563B1

(12) United States Patent
Chen et al.

(10) Patent No.: US 6,463,563 B1
(45) Date of Patent: Oct. 8, 2002

(54) SINGLE SYMBOL CORRECTION DOUBLE SYMBOL DETECTION CODE EMPLOYING A MODULAR H-MATRIX

(75) Inventors: Chin-Long Chen, Fishkill, NY (US); Mu-Yue Hsiao, Poughkeepsie, NY (US); Patrick J. Meaney, Poughkeepsie, NY (US); William Wu Shen, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/451,133

(22) Filed: Nov. 30, 1999

(51) Int. Cl.$^7$ ................................................ G11C 29/00
(52) U.S. Cl. ...................................................... 714/768
(58) Field of Search ................................ 714/751–754, 714/757, 758, 762, 779, 781, 763–768, 777

(56) References Cited

U.S. PATENT DOCUMENTS

| | | | |
|---|---|---|---|
| 3,811,108 A | 5/1974 | Howell | 714/762 |
| 4,241,446 A | 12/1980 | Trubisky | 714/777 |
| 4,450,561 A | 5/1984 | Gotze et al. | 714/757 |
| 4,464,753 A | 8/1984 | Chen | 371/38 |
| 4,631,725 A | 12/1986 | Takamura et al. | 714/752 |
| 4,862,463 A | 8/1989 | Chen | 371/38 |
| 5,115,436 A | 5/1992 | McAuley | 714/781 |
| 5,457,702 A | 10/1995 | Williams et al. | 714/755 |
| 5,774,481 A | 6/1998 | Meaney et al. | 371/40.1 |
| 5,841,795 A | 11/1998 | Olarig et al. | 370/40.13 |
| 5,978,952 A | 11/1999 | Hayek et al. | 714/764 |
| 6,052,818 A | 4/2000 | Dell et al. | 714/763 |
| 6,154,868 A | 11/2000 | Cox et al. | 714/784 |

OTHER PUBLICATIONS

Chen, C.L., and Hsiao, M.Y., Error–Correcting Codes for Semiconductor Memory Applications: A State–of–the–Art Review, 28 IBM Journal of Research and Development, 124 (Mar., 1984).

*Primary Examiner*—Albert Decady
*Assistant Examiner*—C R Harris
(74) *Attorney, Agent, or Firm*—Lawrence D. Cutter, Esq.; Kevin P. Radigan, Esq.; Heslin Rothenberg Farley & Mesiti P.C.

(57) ABSTRACT

An error correction code for single symbol error correction and double symbol error detection is generated according to a novel modular H-matrix. The H-matrix utilizes a modular design with multiple iterations of a plurality of subsets. In particular, one example of this H-matrix includes a plurality of rows and columns with each of at least one row of the H-matrix comprising, in part, multiple iterations of one subset of the plurality of subsets. The remainder of the rows, comprises, in part, a cyclic permutation of all of the remaining subsets of the plurality of subsets.

70 Claims, 12 Drawing Sheets

$$H = \begin{bmatrix} M0V0 & M0V0 & M0V0 & M0V0 & M0V0 \\ M1V0 & M5V1 & M4V1 & M3V0 & M2V0 \\ M2V0 & M1V0 & M5V1 & M4V1 & M3V0 \\ M3V0 & M2V0 & M1V0 & M5V1 & M4V1 \\ M4V1 & M3V0 & M2V0 & M1V0 & M5V1 \\ M5V1 & M4V1 & M3V0 & M2V0 & M1V0 \end{bmatrix} I_{12}$$

$$M_0 = \begin{bmatrix} 00000000001010101010101010 \\ 00000000001010101010101 \end{bmatrix}$$

$$M_1 = \begin{bmatrix} 0010111101000010010011010 0 \\ 000110101100000111001011 00 \end{bmatrix}$$

$$M_2 = \begin{bmatrix} 000000011010110000011010 11 \\ 000000110101100000110101 10 \end{bmatrix}$$

$$M_3 = \begin{bmatrix} 1010001010100011100000001 0 \\ 0101000101010010010000000 1 \end{bmatrix}$$

$$M_4 = \begin{bmatrix} 10001000100010001111101010 \\ 01000100010001001010010101 \end{bmatrix}$$

$$M_5 = \begin{bmatrix} 1010010010000000001001111 1 \\ 0101110001000000000111101 0 \end{bmatrix}$$

$$I_{12} = \begin{bmatrix} 100000000000 \\ 010000000000 \\ 001000000000 \\ 000100000000 \\ 000010000000 \\ 000001000000 \\ 000000100000 \\ 000000010000 \\ 000000001000 \\ 000000000100 \\ 000000000010 \\ 000000000001 \end{bmatrix}$$

$$V_0 = \begin{bmatrix} 10 \\ 01 \end{bmatrix}$$

$$V_1 = \begin{bmatrix} 01 \\ 11 \end{bmatrix}$$

DATA IN
10, 12, 14, 16, 18, 20, 22, 24, 36, 38, 40, 42, 44
46, 48, 50, 62, 64, 66, 68, 70, 72, 74, 76, 88, 90
92, 94, 96, 98, 100, 102, 114, 116, 118, 120, 122, 124, 126, 128

$$H = \begin{bmatrix} M_0 M_0 M_0 M_0 M_0 V_0 V_0 \\ M_1 M_5 M_4 M_3 M_2 V_0 V_0 \\ M_2 M_1 M_5 M_4 M_3 V_0 V_1 \\ M_3 M_2 M_1 M_5 M_4 V_0 V_1 \\ M_4 M_3 M_2 M_1 M_5 V_1 V_0 \\ M_5 M_4 M_3 M_2 M_1 V_1 V_0 \end{bmatrix} I_{12}$$

$$M_0 = \begin{bmatrix} 000000000010101010101010 \\ 000000000001010101010101 \end{bmatrix}$$

$$M_1 = \begin{bmatrix} 001011110100001001001101 00 \\ 000110101100000111001011 00 \end{bmatrix}$$

$$M_2 = \begin{bmatrix} 000000011010110000011010 11 \\ 000000110101100000110101 10 \end{bmatrix}$$

$$M_3 = \begin{bmatrix} 101000101010001110000000 10 \\ 010100010101001001000000 01 \end{bmatrix}$$

$$M_4 = \begin{bmatrix} 100010001000100011111010 10 \\ 010001000100010010100101 01 \end{bmatrix}$$

$$M_5 = \begin{bmatrix} 101001001000000000100111 11 \\ 010111000100000000011110 10 \end{bmatrix}$$

$$V_0 = \begin{bmatrix} 10 \\ 01 \end{bmatrix}$$

$$V_1 = \begin{bmatrix} 01 \\ 11 \end{bmatrix}$$

$$I_{12} = \begin{bmatrix} 100000000000 \\ 010000000000 \\ 001000000000 \\ 000100000000 \\ 000010000000 \\ 000001000000 \\ 000000100000 \\ 000000010000 \\ 000000001000 \\ 000000000100 \\ 000000000010 \\ 000000000001 \end{bmatrix}$$

*fig. 10*

| | 0 | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|---|
| | 000 | 000 | 000 | 000 | 000 | 101 | 101 | 101 | 101 | 101 | 101 | 101 | 101 | 000 | 000 | 000 | 000 | 000 | 101 |
| | 000 | 000 | 000 | 000 | 000 | 011 | 011 | 011 | 011 | 011 | 011 | 011 | 101 | 000 | 000 | 000 | 000 | 000 | 011 |
| | 000 | 101 | 101 | 110 | 011 | 000 | 000 | 101 | 011 | 011 | 011 | 011 | 011 | 000 | 000 | 011 | 000 | 000 | 000 |
| | 000 | 011 | 101 | 101 | 110 | 000 | 000 | 011 | 110 | 000 | 110 | 000 | 000 | 101 | 101 | 110 | 000 | 101 | 000 |
| | 000 | 000 | 000 | 011 | 011 | 000 | 110 | 000 | 000 | 000 | 101 | 110 | 000 | 011 | 011 | 110 | 110 | 011 | 000 |
| | 000 | 000 | 000 | 110 | 011 | 000 | 101 | 000 | 000 | 011 | 101 | 101 | 110 | 000 | 101 | 101 | 110 | 110 | 000 |
| | 101 | 101 | 000 | 101 | 101 | 101 | 000 | 110 | 101 | 000 | 011 | 101 | 000 | 011 | 101 | 101 | 101 | 101 | 101 |
| | 011 | 000 | 101 | 011 | 101 | 011 | 000 | 110 | 101 | 101 | 011 | 101 | 101 | 000 | 000 | 000 | 011 | 011 | 101 |
| | 101 | 000 | 101 | 000 | 011 | 000 | 110 | 000 | 101 | 101 | 011 | 011 | 101 | 000 | 000 | 000 | 110 | 101 | 101 |
| | 011 | 000 | 011 | 000 | 101 | 000 | 101 | 000 | 000 | 011 | 011 | 011 | 011 | 101 | 101 | 101 | 101 | 101 | 101 |
| | 101 | 101 | 011 | 000 | 011 | 000 | 000 | 000 | 000 | 011 | 110 | 110 | 110 | 101 | 101 | 011 | 000 | 101 | 000 |
| | 011 | 011 | 110 | 000 | 011 | 000 | 000 | 000 | 000 | 011 | 110 | 101 | 101 | 011 | 000 | 011 | 000 | 011 | 000 |

*fig. 11A*

| 19 | 20 | 21 | 22 | 23 | 24 | 25 | 26 | 27 | 28 | 29 | 30 | 31 | 32 | 33 | 34 | 35 | 36 | 37 |
|---|---|---|---|---|---|---|---|---|---|---|---|---|---|---|---|---|---|---|
| 101 | 101 | 101 | 101 | 101 | 101 | 101 | 000 | 000 | 000 | 000 | 000 | 101 | 101 | 101 | 101 | 101 | 101 | 101 |
| 011 | 011 | 011 | 011 | 011 | 011 | 011 | 000 | 000 | 000 | 000 | 000 | 011 | 011 | 011 | 011 | 011 | 011 | 011 |
| 000 | 000 | 000 | 101 | 011 | 110 | 110 | 101 | 000 | 101 | 000 | 101 | 000 | 101 | 000 | 011 | 011 | 011 | 011 |
| 000 | 000 | 000 | 011 | 011 | 101 | 101 | 000 | 000 | 011 | 000 | 011 | 000 | 011 | 000 | 110 | 110 | 101 | 101 |
| 000 | 101 | 011 | 000 | 110 | 011 | 000 | 101 | 101 | 011 | 000 | 101 | 000 | 000 | 000 | 101 | 101 | 011 | 011 |
| 000 | 011 | 000 | 000 | 011 | 110 | 000 | 011 | 011 | 110 | 110 | 011 | 000 | 000 | 000 | 000 | 000 | 110 | 110 |
| 110 | 000 | 011 | 101 | 110 | 000 | 110 | 000 | 101 | 110 | 011 | 110 | 000 | 000 | 000 | 000 | 000 | 000 | 000 |
| 101 | 000 | 000 | 101 | 101 | 101 | 101 | 000 | 011 | 110 | 101 | 101 | 101 | 000 | 101 | 101 | 101 | 101 | 101 |
| 000 | 101 | 000 | 000 | 000 | 000 | 000 | 000 | 101 | 101 | 011 | 011 | 011 | 110 | 011 | 011 | 011 | 011 | 011 |
| 000 | 000 | 011 | 011 | 000 | 000 | 011 | 101 | 101 | 000 | 101 | 101 | 101 | 101 | 000 | 000 | 000 | 101 | 101 |
| 101 | 101 | 000 | 101 | 101 | 101 | 101 | 101 | 101 | 000 | 101 | 101 | 000 | 000 | 110 | 101 | 110 | 101 | 101 |
| 011 | 000 | 101 | 011 | 011 | 011 | 011 | 011 | 011 | 011 | 011 | 011 | 011 | 000 | 101 | 011 | 000 | 011 | 011 |
| 011 | 000 | 101 | 011 | 011 | 011 | 011 | 011 | 000 | 000 | 011 | 000 | 000 | 000 | 000 | 011 | 000 | 000 | 000 |

*fig. 11B*

| 38 | 39 | 40 | 41 | 42 | 43 | 44 | 45 | 46 | 47 | 48 | 49 | 50 | 51 | 52 | 53 | 54 | 55 | 56 |
|---|---|---|---|---|---|---|---|---|---|---|---|---|---|---|---|---|---|---|
| 101 | 000 | 000 | 000 | 000 | 000 | 101 | 101 | 101 | 101 | 101 | 101 | 101 | 101 | 000 | 000 | 000 | 000 | 000 |
| 011 | 000 | 000 | 000 | 000 | 000 | 011 | 011 | 011 | 011 | 011 | 011 | 011 | 011 | 000 | 000 | 000 | 000 | 000 |
| 101 | 101 | 101 | 000 | 101 | 000 | 011 | 011 | 011 | 011 | 011 | 011 | 011 | 011 | 000 | 000 | 000 | 000 | 101 |
| 011 | 011 | 000 | 000 | 011 | 011 | 101 | 000 | 110 | 101 | 000 | 000 | 000 | 101 | 000 | 000 | 000 | 011 | 011 |
| 110 | 101 | 000 | 101 | 000 | 101 | 011 | 000 | 101 | 011 | 000 | 000 | 000 | 011 | 000 | 101 | 000 | 110 | 011 |
| 101 | 011 | 000 | 011 | 000 | 011 | 000 | 101 | 000 | 110 | 110 | 101 | 101 | 101 | 101 | 011 | 000 | 101 | 101 |
| 000 | 101 | 011 | 011 | 011 | 101 | 000 | 011 | 000 | 101 | 101 | 011 | 011 | 011 | 011 | 000 | 101 | 011 | 011 |
| 000 | 011 | 011 | 110 | 000 | 011 | 000 | 000 | 000 | 000 | 000 | 110 | 110 | 110 | 101 | 000 | 011 | 000 | 101 |
| 110 | 000 | 110 | 101 | 101 | 110 | 000 | 000 | 000 | 000 | 110 | 101 | 101 | 101 | 101 | 101 | 110 | 000 | 011 |
| 101 | 000 | 101 | 101 | 101 | 011 | 000 | 000 | 101 | 011 | 000 | 011 | 011 | 000 | 011 | 011 | 110 | 000 | 101 |
| 101 | 000 | 011 | 101 | 000 | 101 | 000 | 101 | 011 | 110 | 000 | 110 | 110 | 110 | 000 | 000 | 101 | 110 | 011 |
| 011 | 000 | 000 | 101 | 011 | 101 | 101 | 101 | 000 | 000 | 011 | 101 | 101 | 101 | 011 | 101 | 101 | 101 | 011 |
| 011 | 000 | 000 | 000 | 110 | 011 | 011 | 011 | 000 | 000 | 000 | 110 | 011 | 000 | 000 | 011 | 101 | 101 | 110 |

*fig. 11C*

| 57 | 58 | 59 | 60 | 61 | 62 | 63 | 64 | 65 | 66 | 67 | 68 | 69 | 70 | 71 | 72 |
|---|---|---|---|---|---|---|---|---|---|---|---|---|---|---|---|
| 101 | 101 | 101 | 101 | 101 | 101 | 101 | 101 | 101 | 101 | 101 | 000 | 000 | 000 | 000 | 000 |
| 011 | 011 | 011 | 011 | 011 | 011 | 011 | 011 | 011 | 011 | 011 | 000 | 000 | 000 | 000 | 000 |
| 101 | 101 | 000 | 000 | 011 | 101 | 101 | 110 | 101 | 101 | 011 | 101 | 000 | 000 | 000 | 000 |
| 011 | 011 | 000 | 000 | 110 | 011 | 011 | 101 | 011 | 011 | 000 | 011 | 000 | 000 | 000 | 000 |
| 101 | 101 | 000 | 101 | 000 | 000 | 000 | 101 | 101 | 101 | 000 | 000 | 101 | 000 | 000 | 000 |
| 011 | 011 | 000 | 011 | 000 | 000 | 000 | 011 | 011 | 011 | 000 | 000 | 011 | 000 | 000 | 000 |
| 000 | 000 | 101 | 000 | 110 | 101 | 101 | 011 | 011 | 110 | 000 | 000 | 000 | 101 | 000 | 000 |
| 000 | 000 | 011 | 000 | 101 | 011 | 011 | 101 | 101 | 011 | 000 | 000 | 000 | 011 | 000 | 000 |
| 000 | 000 | 101 | 000 | 000 | 101 | 101 | 011 | 011 | 101 | 000 | 000 | 000 | 000 | 101 | 000 |
| 000 | 000 | 011 | 000 | 000 | 011 | 011 | 110 | 110 | 011 | 000 | 000 | 000 | 000 | 011 | 000 |
| 000 | 000 | 000 | 101 | 101 | 110 | 110 | 101 | 101 | 101 | 000 | 000 | 000 | 000 | 000 | 101 |
| 000 | 000 | 000 | 011 | 011 | 011 | 011 | 000 | 000 | 011 | 000 | 000 | 000 | 000 | 000 | 011 |
| 000 | 000 | 000 | 110 | 000 | 110 | 110 | 000 | 011 | 011 | 000 | 000 | 000 | 000 | 000 | 000 |

*fig. 11D*

$$H = \begin{bmatrix} M_0V_0 & M_0V_0 & M_0V_0 & M_0V_0 & M_0V_0 \\ M_1V_0 & M_5V_1 & M_4V_1 & M_3V_0 & M_2V_0 \\ M_2V_0 & M_1V_0 & M_5V_1 & M_4V_1 & M_3V_0 \\ M_3V_0 & M_2V_0 & M_1V_0 & M_5V_1 & M_4V_1 \\ M_4V_1 & M_3V_0 & M_2V_0 & M_1V_0 & M_5V_1 \\ M_5V_1 & M_4V_1 & M_3V_0 & M_2V_0 & M_1V_0 \end{bmatrix} I_{12}$$

$$M_0 = \begin{bmatrix} 00000000001010101010101010 \\ 00000000000101010101010101 \end{bmatrix}$$

$$M_1 = \begin{bmatrix} 0010111010000100100110100 \\ 0001101011000011100101100 \end{bmatrix}$$

$$M_2 = \begin{bmatrix} 0000000110101100000110101011 \\ 0000001101011000001101 0110 \end{bmatrix}$$

$$M_3 = \begin{bmatrix} 1010001010100011100000010 \\ 0101000101010010010000001 \end{bmatrix}$$

$$M_4 = \begin{bmatrix} 10001000100010001111101010 \\ 01000100010001001010010101 \end{bmatrix}$$

$$M_5 = \begin{bmatrix} 1010010010000000010011111 \\ 0101110001000000001111010 \end{bmatrix}$$

$$V_0 = \begin{bmatrix} 10 \\ 01 \end{bmatrix}$$

$$V_1 = \begin{bmatrix} 01 \\ 11 \end{bmatrix}$$

$$I_{12} = \begin{bmatrix} 100000000000 \\ 010000000000 \\ 001000000000 \\ 000100000000 \\ 000010000000 \\ 000001000000 \\ 000000100000 \\ 000000010000 \\ 000000001000 \\ 000000000100 \\ 000000000010 \\ 000000000001 \end{bmatrix}$$

fig. 12

$$H = \begin{bmatrix} M_0V_0V_0 & M_0V_0V_0 & M_0V_0V_0 & M_0V_0V_0 & M_0V_0V_0 \\ M_1V_0V_0 & M_5V_1V_2 & M_4V_1V_2 & M_3V_0V_0 & M_2V_0V_1 \\ M_2V_0V_1 & M_1V_0V_0 & M_5V_1V_2 & M_4V_1V_2 & M_3V_0V_0 \\ M_3V_0V_0 & M_2V_0V_1 & M_1V_0V_0 & M_5V_1V_2 & M_4V_1V_2 \\ M_4V_1V_2 & M_3V_0V_0 & M_2V_0V_1 & M_1V_0V_0 & M_5V_1V_2 \\ M_5V_1V_2 & M_4V_1V_2 & M_3V_0V_0 & M_2V_0V_1 & M_1V_0V_0 \end{bmatrix} I_{12}$$

$$M_0 = \begin{bmatrix} 00000000001010101010101010 \\ 00000000000101010101010101 \end{bmatrix}$$

$$M_1 = \begin{bmatrix} 0010111101000010010011 0100 \\ 0001101011000001110 0101100 \end{bmatrix}$$

$$M_2 = \begin{bmatrix} 0000000110101100000 1101011 \\ 0000001101011000001 1010110 \end{bmatrix}$$

$$M_3 = \begin{bmatrix} 10100010101000111 00000 0010 \\ 01010001010100100 10000 0001 \end{bmatrix}$$

$$M_4 = \begin{bmatrix} 1000100010001000111110 1010 \\ 0100010001000100101001 0101 \end{bmatrix}$$

$$M_5 = \begin{bmatrix} 1010010010000000001001 1111 \\ 0101110001000000000111 1010 \end{bmatrix}$$

$$V_0 = \begin{bmatrix} 10 \\ 01 \end{bmatrix}$$

$$V_1 = \begin{bmatrix} 01 \\ 11 \end{bmatrix}$$

$$V_2 = \begin{bmatrix} 11 \\ 10 \end{bmatrix}$$

$$I_{12} = \begin{bmatrix} 100000000000 \\ 010000000000 \\ 001000000000 \\ 000100000000 \\ 000010000000 \\ 000001000000 \\ 000000100000 \\ 000000010000 \\ 000000001000 \\ 000000000100 \\ 000000000010 \\ 000000000001 \end{bmatrix}$$

*fig. 13*

SINGLE SYMBOL CORRECTION DOUBLE SYMBOL DETECTION CODE EMPLOYING A MODULAR H-MATRIX

CROSS-REFERENCES TO RELATED APPLICATIONS

This application contains subject matter which is related to the subject matter of the following applications, each of which is assigned to the same assignee as this application and filed on the same day as this application. Each of the below listed applications is hereby incorporated herein by reference in its entirety:

"Detecting Address Faults In An ECC-Protected Memory," Chen et al., Ser. No. 09/451,261; "Generating Special Uncorrectable Error Codes For Failure Isolation," Chen et al., Ser. No. 09/452,079; and "Method, System And Program Products For Error Correction Code Conversion," Chen et al., Ser. No. 09/450,548.

TECHNICAL FIELD

This invention relates, in general, to computer error correction codes and, in particular, to an error correction code, generated according to a novel H-matrix, for use in correcting all single symbol errors and detecting all double symbol errors in a data word.

BACKGROUND ART

The small size of computer transistors and capacitors, combined with transient electrical and electromagnetic phenomena cause occasional errors in stored information in computer memory systems. Therefore, even well-designed and generally reliable memory systems are susceptible to memory device failures.

In an effort to minimize the effects of these memory device failures, various error checking schemes have been developed to detect, and in some cases correct, errors in messages read from memory. The simplest error detection scheme is the parity bit. A parity bit is an extra bit included with a binary data message or data word to make the total number of 1's in the message either odd or even. For "even parity" systems, the parity bit is set to make the total number of 1's in the message even. For "odd parity" systems, the parity bit is set to make the total number of 1's in the message odd. For example, in a system utilizing odd parity, a message having two 1's would have its parity bit set to 1, thereby making the total number of 1's odd. Then, the message including the parity bit is transmitted and subsequently checked at the receiving end for errors. An error results if the parity of the data bits in the message does not correspond to the parity bit transmitted. As a result, single bit errors can be detected. However, since there is no way to detect which particular bit is in error, correction is not possible. Furthermore, if two or any even number of bits are in error, the parity will be correct and no error will be detected. Parity therefore is capable of detecting only odd numbers of errors and is not capable of correcting any bits determined to be in error.

Error correction codes (ECCs) have thus been developed to not only detect but also correct bits determined to be in error. ECCs utilize multiple parity check bits stored with the data message in memory. Each check bit is a parity bit for a group of bits in the data message. When the message is read from memory, the parity of each group, including the check bit, is evaluated. If the parity is correct for all of the groups, it signifies that no detectable error has occurred. If one or more of the newly generated parity values are incorrect, a unique pattern called a syndrome results which may be used to identify the bit in error. Upon detection of the particular bit in error, the error may be corrected by complementing the erroneous bit.

A widely used type of ECC utilized in error control in digital systems is based on the codes devised by R. W. Hamming, and thus take the name "Hamming codes". One particular subclass of Hamming codes includes the single error correcting and double error detecting (SEC-DED) codes. As their name suggests, these codes may be utilized not only to correct any single bit error but also to detect double bit errors.

Another type of well-known ECC is the single symbol correction and double symbol detection (SSC-DSD) codes which are used to correct single symbol errors and detect double symbol errors. In systems implementing these types of codes, the symbol represents a multiple bit package or chip. Hence, as the name implies, an SSC-DSD code in a system utilizing n bit symbols would be capable of correcting n bits in a single symbol and detecting errors occurring in double symbols.

In any of these systems, and as with digital systems in general, ease of implementation is always desirable, and it is to this issue which the present invention is directed.

SUMMARY OF THE INVENTION

An easily implemented error correction code is provided through the provision of a single symbol error correction and double symbol error detection code generated according to a novel, modular H-matrix. The H-matrix of the present invention utilizes a modular design with multiple iterations of a plurality of subsets and is thus easily implemented. In particular, one example of this H-matrix includes a plurality of rows and columns wherein each of at least one row of the H-matrix comprises, in part, multiple iterations of one subset of the plurality of subsets. The remainder of the rows, in turn, comprises, in part, a cyclic permutation of all of the remaining subsets of the plurality of subsets. By using this modular approach, the H-matrix of the present invention provides exceptional error protection and yet remains easily implemented.

In one example, a method of correcting errors in a data word is disclosed. The method includes generating an error correction code according to an H-matrix comprising a plurality of subsets arranged in a plurality of rows and columns, wherein each of at least one row of the plurality of rows comprises, in part, multiple iterations of one subset of the plurality of subsets, and a remainder of the plurality of rows comprises, in part, a cyclic permutation of all remaining subsets of the plurality of subsets; and detecting errors in the data word according to the error correction code.

In another example, a system of correcting errors in a data word includes, means for generating an error correction code according to an H-matrix comprising a plurality of subsets arranged in a plurality of rows and columns, wherein each of at least one row of the plurality of rows comprises, in part, multiple iterations of one subset of the plurality of subsets, and a remainder of the plurality of rows comprises, in part, a cyclic permutation of all remaining subsets of the plurality of subsets; and means for detecting errors in the data word according to the error correction code.

In yet another example, an article of manufacture including at least one computer usable medium having computer readable program code means embodied therein for causing the correcting of errors in a data word is provided. The computer readable program code means includes computer readable program code means for causing a computer to generate an error correction code according to an H-matrix comprising a plurality of subsets arranged in a plurality of rows and columns, wherein each of at least one of the plurality of rows comprises, in part, multiple iterations of one subset of the plurality of subsets, and a remainder of the plurality of rows comprises, in part, a cyclic permutation of all remaining subsets of the plurality of subsets; and computer readable program code means for causing a computer to effect detecting errors in the data word according to the error correction code.

In this manner, the cyclic permutation structure of the H-matrix enables a common logic circuitry to generate check bits. Specifically, since a subset of a row is a permutation of the subset of another row, XOR trees for the generation of certain check bits are the same. Only the data inputs to the XOR trees are different.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 10 depicts one example of an H-matrix according the present invention;

FIGS. 11A–11D depict one example of a syndrome decoding table generated according to the H-matrix of FIG. 10;

FIG. 12 depicts another example of an H-matrix according the present invention; and FIG. 13 depicts yet another example of an H-matrix according the present invention.

BEST MODE FOR CARRYING OUT THE INVENTION

In accordance with the principles of the present invention, an error correction code capable of correcting single symbol errors and detecting all double symbol errors in a data word is generated according to a novel, modular H-matrix. In one example, the H-matrix comprises a plurality of subsets arranged into a plurality of rows and columns. Each of at least one of these rows comprises, in part, multiple iterations of one subset of the plurality of subsets whereas the remainder of the rows comprises, in part, a cyclic permutation of all the remaining subsets. One example of a computer system incorporating and utilizing the present invention is described in detail with reference to FIG. 1.

Figure 1:
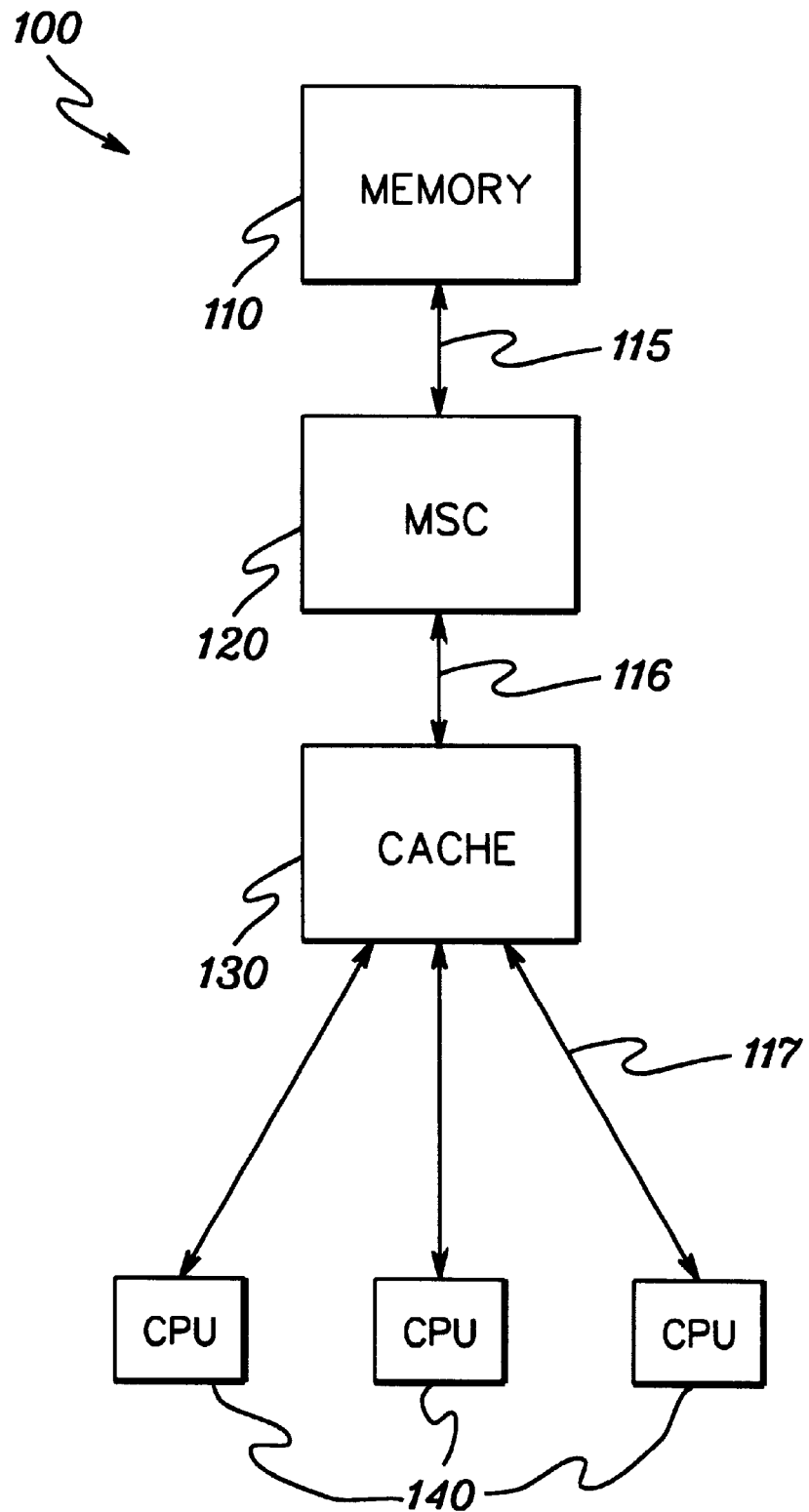
FIG. 1 depicts one example of a computer system in which error correction and/or detection in accordance with the principles of the present invention may be utilized.

FIG. 1 shows a block diagram representation of a computer system 100 utilizing the error correction code of the present invention. In one embodiment, computer system 100 includes a memory 110 connected to a main storage controller (MSC) 120 via a data bus 115, a cache 130 connected to MSC 120 via a data bus 117, and a plurality of central processing units (CPUs) 140 connected to cache 130 via data buses 117. Data buses 117 are used to communicate data between MSC 120 and cache 130 as well as between cache 130 and CPUs 140, respectively, and in this regard may typically be 72 bits wide. Communication of data between memory 110 and MSC 120, on the other hand, occurs via data bus 115. Thus, data bus 115 facilitates the transmission of data read from memory 110 by MSC 120 as well as data written to memory 110 by MSC 120.

Data bus 115, in one embodiment, is 146 bits wide but nevertheless may vary in width according to the requirements of the particular system while still receiving error protection under the ECC of the present invention. In this regard, the ECC of the present invention is specifically designed to meet the data requirements of a wide variety of servers including data buses having widths of, for example, 140, 142, 143, 144, 152, and 162 bits.

The data transmitted in computer system 100 is arranged into a data word having a size dependent on the particular data bus utilized by the system. Furthermore, the data word may be arranged into variably-sized symbols. For instance, in one example, the data word comprises a plurality of two bit symbols. Hence, in this example, a 146 bit data word would include 73 symbols.

Figure 2:
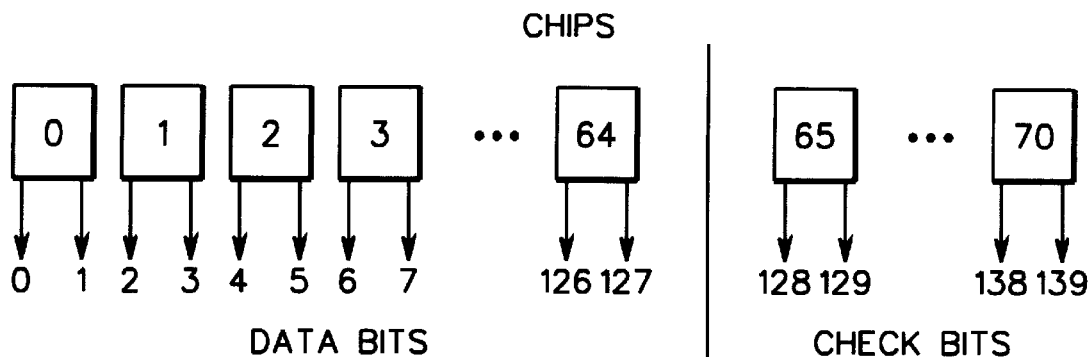
FIG. 2 depicts one example of a memory arrangement in accordance with the present invention.

As shown in FIG. 2, memory 110, for example, comprises a plurality of DRAM devices with each device storing a two-bit package of data on a single chip or symbol. For instance, data bits 0 and 1 are stored on chip 0, and similarly bits 2 and 3 are stored on chip 1. In addition, the embodiment shown in FIG. 2 depicts a 140 bit memory system which is arranged such that the first 128 bits (0–127) are used for data storage and the last 12 bits (128–139) are used to store a plurality of check bits.

In accordance with the principles of the present invention, the check bits are generated as data is transmitted from MSC 120 to memory 110. Upon generation, the check bits are stored, together with the transmitted data, in memory 110. As mentioned above, in the embodiment depicted in FIG. 2, twelve check bits are generated and stored on chips 65–70, with each check bit being associated with a group of data bits stored on chips 0–64. The generation of the check bits is discussed below in detail with reference to FIGS. 2, 3, 10, 12 and 13.

FIGS. 10, 12 and 13 depict various embodiments of an H-matrix generated in accordance with the principles of the present invention. In each of FIGS. 10, 12 and 13, the H-matrix is shown comprising a plurality of subsets arranged in a plurality of rows and columns. In addition, each of at least one of the rows comprises, in part, multiple iterations of one subset of the plurality of subsets, whereas the remainder of the rows comprises, in part, a cyclic permutation of all of the remaining subsets of the plurality of subsets.

In the example depicted in FIG. 10, one H-matrix is shown including a plurality of 2×26 modular matrices M0–M5, a plurality of 2×2 matrices V0–V1, and matrix I12, which represents a 12×12 identity matrix. As can be seen, the top row of the H-matrix in FIG. 10 comprises, in part, multiple iterations of subset M0 and the remainder of the rows comprises, in part, a cyclic permutation of the remaining subsets M1–M5. In addition to comprising the subsets M1–M5, the rows of the H-matrix also comprise various iterations of the V0 and V1 matricies, as well as the I12 matrix. Other examples of H-matrices generated according to the principles of the present invention are depicted in FIGS. 12 and 13. Similar to the example shown in FIG. 10, the embodiments depicted in FIGS. 12 and 13 also include a plurality of rows and columns with the top row comprising multiple iterations of one subset and with the remainder of the rows comprising a cyclic permutation of the remaining subsets. Furthermore, although each of the embodiments shown in FIGS. 10, 12 and 13 depicts a top row comprising, in part, multiple iterations of one subset, it is to be understood that the row comprising, in part, multiple iterations of one subset is not limited to the top row of the H-matrix and, to the contrary, any one of the rows of the H-matrix may comprise, in part, multiple iterations of one subset with the remaining rows comprising, in part, a cyclic permutation of the remaining subsets. Also, although each of the embodiments shown in FIGS. 10, 12 and 13 depict a particular arrangement of rows and columns, it is to be understood that each row is interchangeable with any other row, and likewise any column is interchangeable with any other column.

In addition, the H-matrix of the present invention may be implemented so that each subset M0–M5 is iterated no more than five times. For example, in the H-matrix depicted in FIG. 10, each of subsets M0, M1, M2, M3, M4 and M5 is iterated five times each on the left-hand side of the H-matrix before iterating matrices V0 and V1. Similarly, FIGS. 12 and 13 depict H-matrices comprising subsets M0, M1, M2, M3, M4 and M5 each iterated five times with matrices V0, V1 and V2 interposed between the subsets. As a result of the utilization of the modular structure described above, the H-matrix of the present invention becomes much easier to implement within its particular host computer system.

Figure 4:
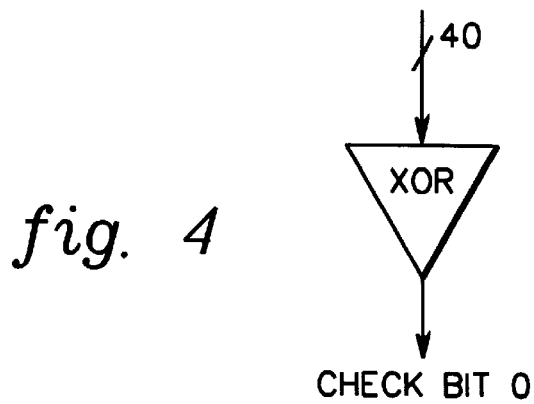
FIG. 4 depicts one example of a portion of the circuit of FIG. 3 used to generate a single check bit.

The H-matrix of FIG. 10, when expanded, has 146 columns and 12 rows. The first 134 columns (M0–M5 and V0 and V1) are designated as data columns and the last 12 columns (I12) are designated as ECC check columns. Furthermore, each row of the H-matrix is associated with and used to generate a single check bit. More specifically, each instance of a 1 in a row designates a data bit which is to be included in a specific group of data bits. This specific group of data bits, in turn, is used to generate a corresponding check bit. In particular, a check bit is generated by performing an exclusive OR (XOR) operation on each of the data bits of the data word as specified by the particular row of the H-matrix corresponding to that particular check bit. For example, FIG. 4 depicts a portion of a circuit used to generate check bit 0 and in this regard indicates that an XOR operation is performed on data bits 10, 12, 14, 16, 18, 20, 22, 24, 36, 38, 40, 42, 44, 46, 48, 50, 62, 64, 66, 68, 70, 72, 74, 76, 88, 90, 92, 94, 96, 98, 100, 102, 114, 116, 118, 120, 122, 124, 126 and 128. The result of this XOR operation represents check bit 0. Consistent with FIG. 4, an examination of row 0 of the H-matrix of FIG. 10, which corresponds to check bit 0, reveals that a 1 resides in each of columns 10, 12, 14, 16, 18, 20, 22, 24, 36, 38, 40, 42, 44, 46, 48, 50, 62, 64, 66, 68, 70, 72, 74, 76, 88, 90, 92, 94, 96, 98, 100, 102, 114, 116, 118, 120, 122, 124, 126 and 128. This procedure is then repeated with respect to each row of the H-matrix to generate a total of 12 check bits associated with the data word.

Figure 3:
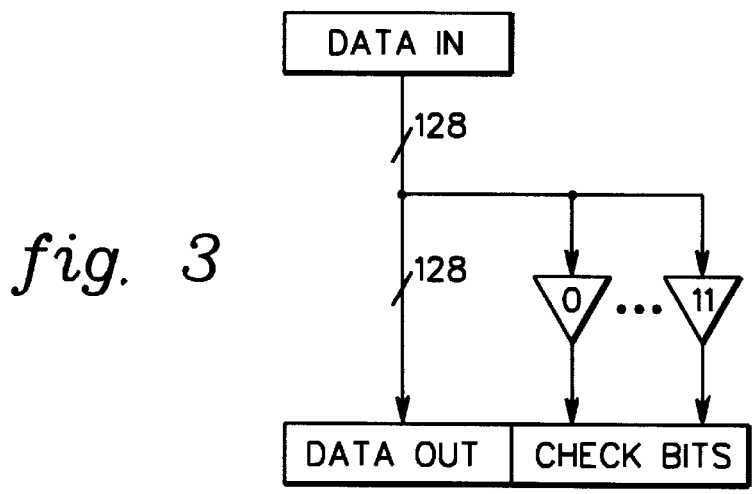
FIG. 3 depicts one example of a circuit used to generate a plurality of check bits associated with a data word in accordance with the present invention.

FIG. 3 depicts a partial circuit diagram of the check bit generation described above including the generation of each of check bits 0–11. In the embodiment depicted in FIG. 3, a 128 bit data word is written to memory together with 12 check bits generated in accordance with the principles of the present invention. As indicated above, each of the 12 check bits of FIG. is generated by XORing a group of data bits selected according to the H-matrix. Subsequently, the 12 check bits, along with the 128 data bits are written to memory until a read operation is performed.

Figure 5:
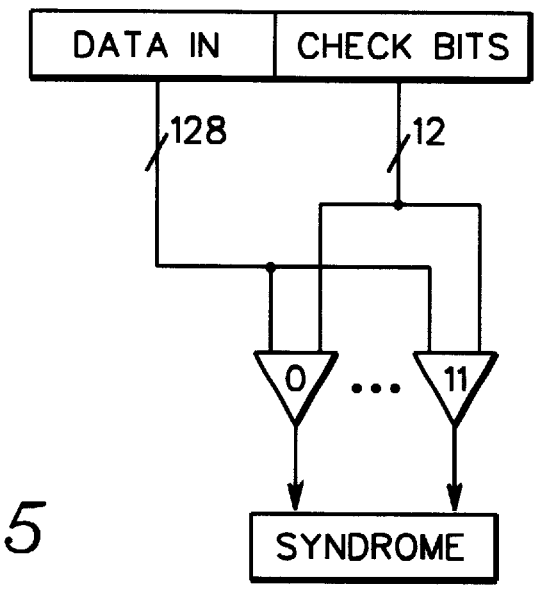
FIG. 5 depicts one example of a circuit used to generate a plurality of syndrome bits associated with the data word in accordance with the present invention.
Figure 6:
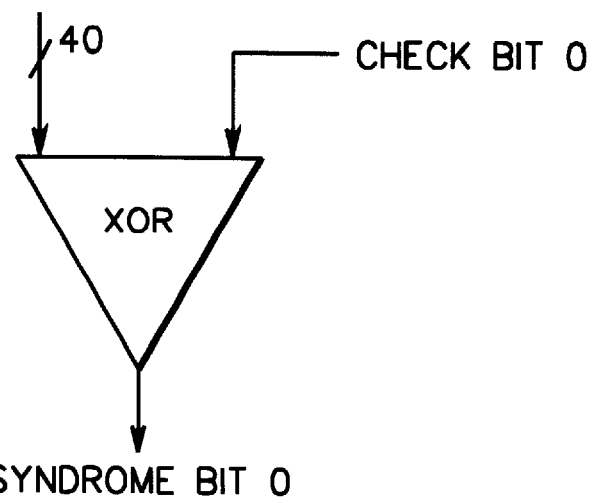
FIG. 6 depicts one example of a portion of the circuit of FIG. 5 used to generate a single syndrome bit.

Subsequent to the generation of the check bits and upon the occurrence of a read operation, a 12 bit syndrome is generated. As depicted in FIG. 5, when a read operation occurs, the 128 data bits together with the 12 associated check bits, previously written to memory as described above, are read from memory. After being read from memory, an XOR operation is again performed to generate the syndrome except that in this instance the XOR operation is performed on the group of data bits determined according to the H-matrix, as well as the corresponding check bit. Specifically, as shown in FIG. 6, an XOR operation is performed on data bits 10, 12, 14, 16, 18, 20, 22, 24, 36, 38, 40, 42, 44, 46, 48, 50, 62, 64, 66, 68, 70, 72, 74, 76, 88, 90, 92, 94, 96, 98, 100, 102, 114, 116, 118, 120, 122, 124, 126 and 128, as well as check bit 0. The result of this XOR operation represents syndrome bit 0. In addition, similar to the generation of the check bits, the data bits used in the XOR are determined according to the H-matrix. In other words, each of the data bits listed in FIG. 6 is shown as having a 1 in row 0 of the H-matrix of FIG. 10, and is also included in the group of data bits used to generate check bit 0 as described above. This procedure is then repeated with respect to each row of the H-matrix and with each corresponding check bit to generate a total of 12 syndrome bits associated with the data word.

Figure 7:
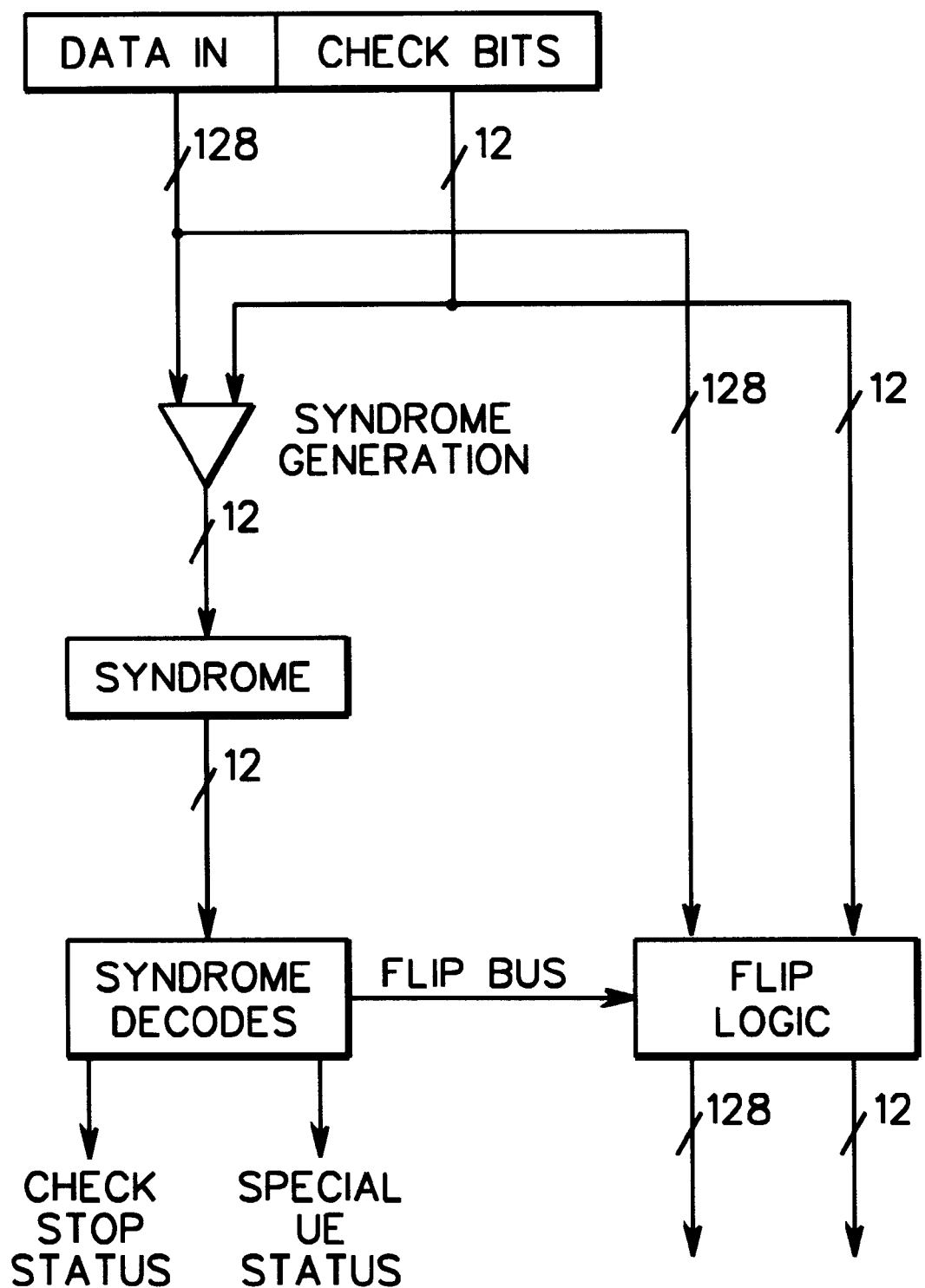
FIG. 7 depicts one example of a circuit used to decode the syndrome and correct any bits determined to be in error in accordance with the present invention.

After generation, as shown in FIG. 7, the syndrome is decoded to determine the presence of any erroneous data or check bits. In accordance with the principles of the invention, subsequent to syndrome decoding, any single error or double errors in a single symbol are corrected, as depicted in the FLIP LOGIC box of FIG. 7. Syndrome decoding is discussed below with reference to FIGS. 8 and 11, and error correction is discussed with reference to FIG. 9.

FIG. 11 depicts one embodiment of a syndrome decode table used to decode the syndrome generated above. Although alternate embodiments may exist, this particular decode table corresponds to the H-matrix of FIG. 9 and is comprised of a 12 row by 73 column table. Each of the 73 columns, in turn, corresponds to a particular symbol or chip of the data word. For instance, column 0 corresponds to symbol 0, and likewise, column 11 corresponds to symbol 11. Furthermore, each column is comprised of 3 sub-columns, with the first sub-column corresponding to the first bit of the symbol to which the column corresponds, the second sub-column corresponding to the second bit of the symbol to which the column corresponds, and the third sub-column corresponding to both the first and the second bits of the symbol to which the column corresponds. For instance, the first sub-column of column 1 corresponds to the first bit of symbol 1, the second sub-column of column 1 corresponds to the second bit of symbol 1, and the third sub-column of column 1 corresponds to both the first and the second bit of symbol 1.

The first two sub-columns of each column of the decode table are determined according to the H-matrix. Specifically, the first two sub-columns of each column are identical to their corresponding columns of the H-matrix. For example, the first sub-column of column 0 of the decode table is equal to column 0 of the H-matrix. Similarly, the second sub-column of column 2 of the decode table is equal to column 5 of the H-matrix. The third sub-columns of decode table columns, on the other hand, are determined by XORing the first and second sub-column of the respective column. Thus, XORing the first and second sub-columns of row 0, column 0 (i.e., 0 and 0) results in the 0 residing in the third sub-column of row 0, column 0, and likewise XORing the first and second sub-columns of row 2, column 1 (i.e., 1 and 0) results in the 1 residing in the third sub-column of row 2, column 1.

As noted above, the decode table of FIG. 10 comprises 12 rows. Each of these rows, in turn, corresponds to one bit of the 12 bit syndrome. Thus in this embodiment, the top row of the decode table corresponds to syndrome bit 0, and similarly, the bottom row of the decode table corresponds to syndrome bit 11.

After generating the syndrome bits, the syndrome is compared against the individual syndrome patterns in the syndrome decode table to determine whether a bit in error exists, and, if an error exists, to determine the location of any single symbol errors (i.e., either one error or two errors located on a single symbol), or the existence of any multiple symbol errors (i.e., errors existing on more than one symbol). First, if each and every bit of the syndrome is zero, no error exists and the data word requires no modification. If, however, each bit of the syndrome is not zero, the syndrome must be compared with the sub-columns of the columns of the decode table to determine the location of single symbol errors or in the alternative to detect the presence of multiple symbol errors.

Figure 8:
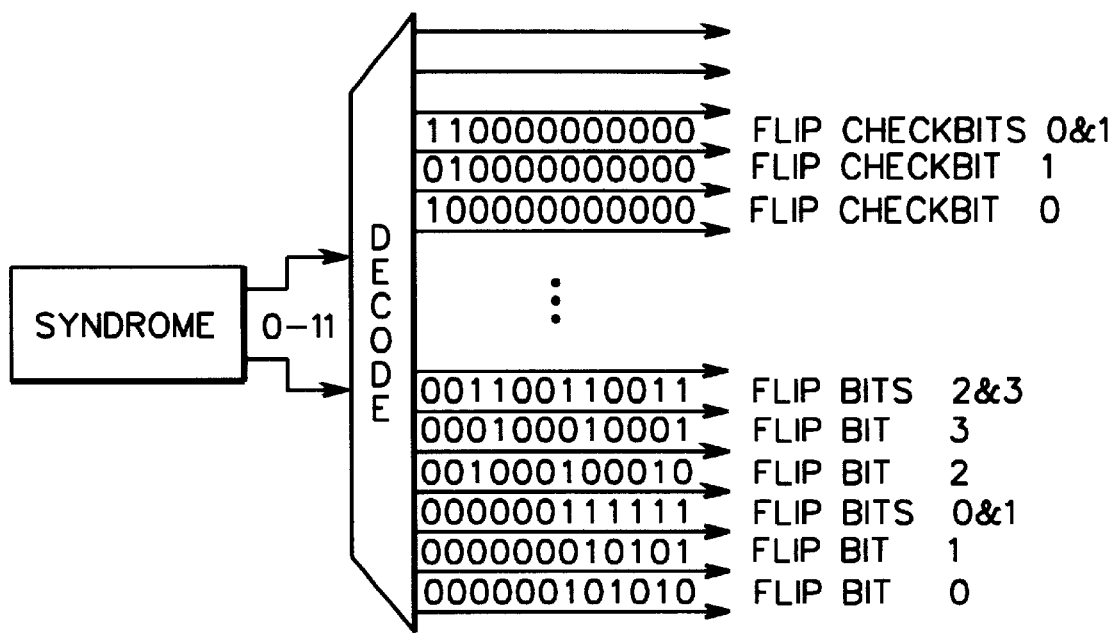
FIG. 8 depicts one example of a block diagram of the logic used to decode the syndrome of FIG. 5.

FIG. 8 depicts the logic used in determining the location of single symbol errors and the presence of multiple symbol errors. In this regard, each of the syndrome patterns shown in FIG. 8 corresponds to a sub-column of the decode table of FIG. 11, and as alluded to above, each sub-column indicates that either a single bit is in error, or that two bits in a single symbol are in error. To illustrate, sub-column 0 indicates that the first bit of symbol 0 is in error, sub-column 1 indicates that the second bit of symbol 0 is in error, and sub-column 3 indicates that both the first and the second bits of symbol 0 are in error. Accordingly, the generated syndrome may be compared against the syndrome patterns shown in FIG. 8 to determine the location of any single symbol errors. For instance, a generated syndrome of 000000101010 matches with the bottom syndrome pattern and indicates that the first bit of symbol 0, or in other words, bit 0 is in error. Similarly, a generated syndrome of 001100110011 matches with the sixth syndrome pattern from the bottom and indicates that both the first and the second bit of symbol 1, or in other words, bits 2 and 3 are in error. If, however, there are no matches between the generated syndrome and the sub-columns of the decode table and if all of the syndrome bits are not 0, then a multiple symbol error is determined to exist and an appropriate error message must be generated, as discussed in greater detail below.

Figure 9:
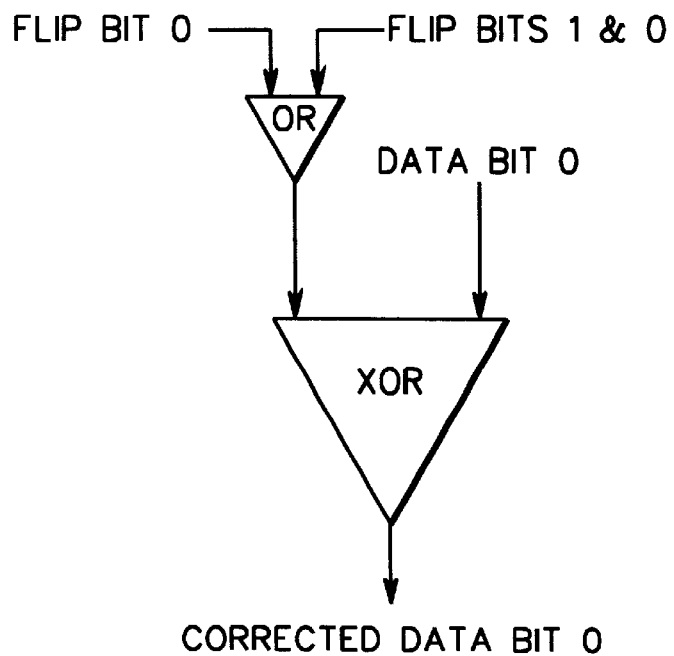
FIG. 9 depicts one example of a circuit used to correct a bit determined to be in error.

Subsequent to decoding the syndrome, uncorrectable error messages are generated in response to the detection of a multiple symbol error. Additionally, any single symbol errors are also corrected at this time. FIG. 9 depicts one embodiment of a circuit used to correct bits determined to be in error. More specifically, the inputs to the OR operation correspond to scenarios that affect the bit at issue. In this case, the bit at issue is bit 0 and the scenarios that affect bit 0 are if bit 0 is in error or if bits 0 and 1 are in error. Each of these inputs is set to 1 if the respective scenario is determined to exist by syndrome decoding as discussed above, otherwise the input is set to 0. Thus, in this example if bit 0 is determined to be in error, that particular input is set to 1. Subsequently, the OR of the two inputs is XORed with the data bit at issue to either correct an erroneous data bit, or leave unmodified a data bit determined to be correct. Hence, in this instance, the OR of the two inputs, or 1, is XORed with data bit 0 to complement data bit 0, thereby producing a corrected data bit 0.

Described in detail above are the computer system and logic used in one embodiment of the present invention to implement an error correction code capable of correcting single symbol errors and detect double symbol errors in a data word. As described herein, an H-matrix in accordance with the principles of the present invention utilizes a modular design with multiple iterations of a plurality of subsets and is thus easily implemented. As discussed above, one example of this H-matrix includes a plurality of rows and columns with each of at least one row of the H-matrix comprising, in part, multiple iterations of one of the subsets of the plurality of subsets. The remainder of the rows, in turn, comprises, in part, a cyclic permutation of all of the remaining subsets of the plurality of subsets.

Furthermore, it should be noted that the specific OR or XOR operations described in the embodiments above are utilized for exemplary reasons only, and that the present invention is not to be construed as being limited to only those specific operations. To the contrary, other operations, for example the complements of the OR and XOR operations, may just as easily be implemented without departing from the principles of the instant invention.

It should also be noted that although the subsets of the above embodiments are depicted as comprising two rows, the present invention is not to be construed as being limited to subsets comprising two rows. To the contrary, a subset having, for example, a single row may just as easily be implemented without departing from the principles of the instant invention.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are merely exemplary. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of correcting symbol errors in a data word, comprising:
    generating a symbol error correction code according to an H-matrix comprising a plurality of subsets arranged in a plurality of rows and columns, wherein each of at least one row of said plurality of rows comprises, in part, multiple iterations of one subset of said plurality of subsets, and a remainder of said plurality of rows comprises, in part, a cyclic permutation of all remaining subsets of said plurality of subsets; and
    detecting symbol errors in the data word according to said symbol error correction code, wherein the detecting further comprises detecting multiple symbol errors in the data word using the symbol error correction code.

2. The method of claim 1, wherein said generating further comprises:
    generating a plurality of check bits associated with the data word according to the H-matrix; and
    generating a syndrome according to the H-matrix, said syndrome being associated with the data word and comprising a plurality of syndrome bits.

3. The method of claim 2, wherein each check bit of said plurality of check bits is generated by performing an exclusive OR function or exclusive NOR function on a distinct group of bits of said data word selected according to said H-matrix.

4. The method of claim 3, wherein said syndrome bits are generated by performing an exclusive OR function or exclusive NOR function on each said check bit and said distinct group of bits of said data word used to generate said particular check bit.

5. The method of claim 2, wherein each syndrome bit of said syndrome corresponds to a distinct check bit.

6. The method of claim 2, wherein said detecting comprises decoding said syndrome to detect any errors in the data word.

7. The method of claim 6, wherein each syndrome bit comprises an error state and an error-free state, and said decoding further comprises:
    indicating no error if each syndrome bit is in its error-free state.

8. The method of claim 7, further comprising:
    comparing, if any of said syndrome bits is in its error state, said syndrome with a syndrome decoder table generated according to the H-matrix to detect any single symbol errors, any double symbol errors, and multiple symbol errors in the data word.

9. The method of claim 8, wherein said syndrome decoder table comprises a plurality of columns, each column of said plurality of columns corresponding to a symbol of the data word and comprising three sub-columns, said first sub-column corresponding to a first bit of said symbol, said second sub-column corresponding to a second bit of said symbol, and said third sub-column being the result of an exclusive OR function performed on said first and said second sub-columns of said symbol, said comparing further comprising:
    comparing said syndrome with said first, second, and third sub-column of each column of said syndrome decoder table, wherein said first bit of said symbol is indicated as being erroneous if said syndrome is equal to the first sub-column, said second bit of said symbol is indicated as being erroneous if said syndrome is equal to the second sub-column, both bits of said symbol are indicated as being erroneous if said syndrome is equal to the third sub-column, and an uncorrectable error is indicated, signifying multiple symbol error, if no matches are made between said syndrome and any of the sub-columns of any of the columns.

10. The method of claim 1, wherein said error correction code is used in a computer system for single symbol error correction as well as said multiple symbol error detection.

11. The method of claim 1, wherein said data word comprises a plurality of two bit symbols.

12. The method of claim 1 further comprising:
    correcting any single symbol errors; and
    generating an uncorrectable error signal if a multiple symbol error is detected.

13. The method of claim 12, where said correcting comprises performing an XOR operation on a single bit or all bits in said single symbol.

14. The method of claim 1, wherein said plurality of subsets comprises n subsets, wherein $3 \leq n \leq 6$.

15. The method of claim 1, wherein said one subset of said plurality of subsets comprises:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix}; \text{ and}$$

said remaining subsets of said plurality of subsets comprises:

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

$$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

$$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix}; \text{ and}$$

$$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix}.$$

16. The method of claim 1, wherein said H-matrix is:

$$H = \begin{bmatrix} M_0 & M_0 & M_0 & M_0 & M_0 & V_0 & V_0 & \\ M_1 & M_5 & M_4 & M_3 & M_2 & V_0 & V_0 & \\ M_2 & M_1 & M_5 & M_4 & M_3 & V_0 & V_1 & I_{12} \\ M_3 & M_2 & M_1 & M_5 & M_4 & V_0 & V_1 & \\ M_4 & M_3 & M_2 & M_1 & M_5 & V_1 & V_0 & \\ M_5 & M_4 & M_3 & M_2 & M_1 & V_1 & V_0 & \end{bmatrix}.$$

17. The method of claim 16, wherein:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix};$$

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

-continued $$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

$$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix};$$

$$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix};$$

$$V_0 = \begin{bmatrix} 10 \\ 01 \end{bmatrix};$$

$$V_1 = \begin{bmatrix} 01 \\ 11 \end{bmatrix}; \text{ and}$$

$$I_{12} = \begin{bmatrix} 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 1 \end{bmatrix}.$$

18. The method of claim 1 wherein, said H-matrix is:

$$H = \begin{bmatrix} M_0 & V_0 & M_0 & V_0 & M_0 & V_0 & M_0 & V_0 & M_0 & V_0 & & \\ M_1 & V_0 & M_5 & V_1 & M_4 & V_1 & M_3 & V_0 & M_2 & V_0 & & \\ M_2 & V_0 & M_1 & V_0 & M_5 & V_1 & M_4 & V_1 & M_3 & V_0 & & I_{12} \\ M_3 & V_0 & M_2 & V_0 & M_1 & V_0 & M_5 & V_1 & M_4 & V_1 & & \\ M_4 & V_1 & M_3 & V_0 & M_2 & V_0 & M_1 & V_0 & M_5 & V_1 & & \\ M_5 & V_1 & M_4 & V_1 & M_3 & V_0 & M_2 & V_0 & M_1 & V_0 & & \end{bmatrix}.$$

19. The method of claim 18, wherein:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix};$$

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

$$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

$$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix};$$

$$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix};$$

$$V_0 = \begin{bmatrix} 10 \\ 01 \end{bmatrix};$$

$$V_1 = \begin{bmatrix} 01 \\ 11 \end{bmatrix}; \text{ and}$$

$$I_{12} = \begin{bmatrix} 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 1 \end{bmatrix}.$$

20. The method of claim 1 wherein said H-matrix is:

$$H = \begin{bmatrix} M_0 & V_0 & V_0 & M_0 & V_0 & V_0 & M_0 & V_0 & V_0 & M_0 & V_0 & V_0 & M_0 & V_0 & V_0 & & \\ M_1 & V_0 & V_0 & M_5 & V_1 & V_2 & M_4 & V_1 & V_2 & M_3 & V_0 & V_0 & M_2 & V_0 & V_1 & & \\ M_2 & V_0 & V_1 & M_1 & V_0 & V_0 & M_5 & V_1 & V_2 & M_4 & V_1 & V_2 & M_3 & V_0 & V_0 & & I_{12} \\ M_3 & V_0 & V_0 & M_2 & V_0 & V_1 & M_1 & V_0 & V_0 & M_5 & V_1 & V_2 & M_4 & V_1 & V_2 & & \\ M_4 & V_1 & V_2 & M_3 & V_0 & V_0 & M_2 & V_0 & V_1 & M_1 & V_0 & V_0 & M_5 & V_1 & V_2 & & \\ M_5 & V_1 & V_2 & M_4 & V_1 & V_2 & M_3 & V_0 & V_0 & M_2 & V_0 & V_1 & M_1 & V_0 & V_0 & & \end{bmatrix}.$$

21. The method of claim 20, wherein:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix};$$

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

$$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

$$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix};$$

$$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix};$$

$$V_0 = \begin{bmatrix} 10 \\ 01 \end{bmatrix};$$

$$V_1 = \begin{bmatrix} 01 \\ 11 \end{bmatrix};$$

$$V_2 = \begin{bmatrix} 11 \\ 10 \end{bmatrix}; \text{ and}$$

$$I_{12} = \begin{bmatrix} 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 1 \end{bmatrix}.$$

22. The method of claim 1, wherein any row of said plurality of rows is interchangeable with any other row of said plurality of rows.

23. The method of claim 1, wherein any column of said plurality of columns is interchangeable with any other column of said plurality of columns.

24. A system of correcting symbol errors in a data word, comprising:
   means for generating a symbol error correction code according to an H-matrix comprising a plurality of subsets arranged in a plurality of rows and columns, wherein each of at least one row of said plurality of rows comprises, in part, multiple iterations of one subset of said plurality of subsets, and a remainder of said plurality of rows comprises, in part, a cyclic permutation of all remaining subsets of said plurality of subsets; and
   means for detecting symbol errors in the data word according to said symbol error correction code, wherein the means for detecting further comprises means for detecting multiple symbol errors in the data word using the symbol error correction code.

25. The system of claim 24, wherein said means for generating further comprises:
   means for generating a plurality of check bits associated with the data word according to the H-matrix; and
   means for generating a syndrome according to the H-matrix, said syndrome being associated with the data word and comprising a plurality of syndrome bits.

26. The system of claim 25, wherein each check bit of said plurality of check bits is generated by performing an exclusive OR function or exclusive NOR function on a distinct group of bits of said data word selected according to said H-matrix.

27. The system of claim 26, wherein said syndrome bits are generated by performing an exclusive OR function or exclusive NOR function on each said check bit and said distinct group of bits of said data word used to generate said particular check bit.

28. The system of claim 25, wherein each syndrome bit of said syndrome corresponds to a distinct check bit.

29. The system of claim 25, wherein said means for detecting comprises means for decoding said syndrome to detect any errors in the data word.

30. The system of claim 29, wherein each syndrome bit comprises an error state and an error-free state, and said means for decoding further comprises:
   means for indicating no error if each syndrome bit is in its error-free state.

31. The system of claim 30, further comprising:
   means for comparing, if any of said syndrome bits is in its error state, said syndrome with a syndrome decoder table generated according to the H-matrix to detect any single symbol errors, any double symbol errors, and multiple symbol errors in the data word.

32. The system of claim 31, wherein said syndrome decoder table comprises a plurality of columns, each column of said plurality of columns corresponding to a symbol of the data word and comprising three sub-columns, said first sub-column corresponding to a first bit of said symbol, said second sub-column corresponding to a second bit of said symbol, and said third sub-column being the result of an exclusive OR function performed on said first and said second sub-columns of said symbol, said means for comparing further comprising:
   means for comparing said syndrome with said first, second, and third sub-column of each column of said syndrome decoder table, wherein said first bit of said symbol is indicated as being erroneous if said syndrome is equal to the first sub-column, said second bit of said symbol is indicated as being erroneous if said syndrome is equal to the second sub-column, both bits of said symbol are indicated as being erroneous if said syndrome is equal to the third sub-column, and an uncorrectable error is indicated, signifying multiple symbol error, if no matches are made between said syndrome and any of the sub-columns of any of the columns.

33. The system of claim 24, wherein said error correction code is used in a computer system for single symbol error correction as well as said multiple symbol error detection.

34. The system of claim 24, wherein said data word comprises a plurality of two bit symbols.

35. The system of claim 24 further comprising:
   means for correcting any single symbol errors; and
   means for generating an uncorrectable error signal if a multiple symbol error is detected.

36. The system of claim 35, where said means for correcting comprises means for performing an XOR operation on a single bit or all bits in said single symbol.

37. The system of claim 24, wherein said plurality of subsets comprises n subsets, wherein $3 \leq n \leq 6$.

38. The system of claim 24, wherein said one subset of said plurality of subsets comprises:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix}; \text{ and}$$

said remaining subsets of said plurality of subsets comprises:

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

$$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

-continued $$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix}; \text{ and}$$

$$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix}.$$

39. The system of claim 24, wherein said H-matrix is:

$$H = \begin{bmatrix} M_0 & M_0 & M_0 & M_0 & M_0 & V_0 & V_0 \\ M_1 & M_5 & M_4 & M_3 & M_2 & V_0 & V_0 \\ M_2 & M_1 & M_5 & M_4 & M_3 & V_0 & V_1 \\ M_3 & M_2 & M_1 & M_5 & M_4 & V_0 & V_1 \\ M_4 & M_3 & M_2 & M_1 & M_5 & V_1 & V_0 \\ M_5 & M_4 & M_3 & M_2 & M_1 & V_1 & V_0 \end{bmatrix} I_{12}.$$

40. The system of claim 39, wherein:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix};$$

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

$$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

$$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix};$$

$$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix};$$

$$V_0 = \begin{bmatrix} 10 \\ 01 \end{bmatrix};$$

$$V_1 = \begin{bmatrix} 01 \\ 11 \end{bmatrix}; \text{ and}$$

$$I_{12} = \begin{bmatrix} 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 1 \end{bmatrix}.$$

41. The system of claim 24 wherein, said H-matrix is:

$$H = \begin{bmatrix} M_0 & V_0 & M_0 & V_0 & M_0 & V_0 & M_0 & V_0 & M_0 & V_0 \\ M_1 & V_0 & M_5 & V_1 & M_4 & V_1 & M_3 & V_0 & M_2 & V_0 \\ M_2 & V_0 & M_1 & V_0 & M_5 & V_1 & M_4 & V_1 & M_3 & V_0 \\ M_3 & V_0 & M_2 & V_0 & M_1 & V_0 & M_5 & V_1 & M_4 & V_1 \\ M_4 & V_1 & M_3 & V_0 & M_2 & V_0 & M_1 & V_0 & M_5 & V_1 \\ M_5 & V_1 & M_4 & V_1 & M_3 & V_0 & M_2 & V_0 & M_1 & V_0 \end{bmatrix} I_{12}.$$

42. The system of claim 41, wherein:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix};$$

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

$$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

$$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix};$$

$$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix};$$

$$V_0 = \begin{bmatrix} 10 \\ 01 \end{bmatrix};$$

$$V_1 = \begin{bmatrix} 01 \\ 11 \end{bmatrix}; \text{ and}$$

$$I_{12} = \begin{bmatrix} 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 1 \end{bmatrix}.$$

43. The system of claim 24 wherein said H-matrix is:

$$H = \begin{bmatrix} M_0 & V_0 & V_0 & M_0 & V_0 & V_0 & M_0 & V_0 & V_0 & M_0 & V_0 & V_0 & M_0 & V_0 & V_0 \\ M_1 & V_0 & V_0 & M_5 & V_1 & V_2 & M_4 & V_1 & V_2 & M_3 & V_0 & V_0 & M_2 & V_0 & V_1 \\ M_2 & V_0 & V_1 & M_1 & V_0 & V_0 & M_5 & V_1 & V_2 & M_4 & V_1 & V_2 & M_3 & V_0 & V_0 \\ M_3 & V_0 & V_0 & M_2 & V_0 & V_1 & M_1 & V_0 & V_0 & M_5 & V_1 & V_2 & M_4 & V_1 & V_2 \\ M_4 & V_1 & V_2 & M_3 & V_0 & V_0 & M_2 & V_0 & V_1 & M_1 & V_0 & V_0 & M_5 & V_1 & V_2 \\ M_5 & V_1 & V_2 & M_4 & V_1 & V_2 & M_3 & V_0 & V_0 & M_2 & V_0 & V_1 & M_1 & V_0 & V_0 \end{bmatrix} \; I_{12}.$$

44. The system of claim 43, wherein:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix};$$

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

$$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

$$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix};$$

$$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix};$$

$$V_0 = \begin{bmatrix} 10 \\ 01 \end{bmatrix};$$

$$V_1 = \begin{bmatrix} 01 \\ 11 \end{bmatrix};$$

$$V_2 = \begin{bmatrix} 11 \\ 10 \end{bmatrix}; \text{ and}$$

$$I_{12} = \begin{bmatrix} 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 1 \end{bmatrix}.$$

45. The system of claim 24, wherein any row of said plurality of rows is interchangeable with any other row of said plurality of rows.

46. The system of claim 24, wherein any column of said plurality of columns is interchangeable with any other column of said plurality of columns.

47. An article of manufacture comprising:
a computer useable medium having computer readable program code means embodied therein for causing the correcting of symbol errors in a data word, the computer readable program code means in said article of manufacture comprising:
computer readable program code means for causing a computer to effect generating a symbol error correction code according to an H-matrix comprising a plurality of subsets arranged in a plurality of rows and columns, wherein each of at least one of said plurality of rows comprises, in part, multiple iterations of one subset of said plurality of subsets, and a remainder of said plurality of rows comprises, in part, a cyclic permutation of all remaining subsets of said plurality of subsets; and
computer readable program code means for causing a computer to effect detecting symbol errors in the data word according to said symbol error correction code, wherein the detecting further comprises detecting multiple symbol errors in the data word using the symbol error correction code.

48. The article of manufacture of claim 47, wherein said computer readable program code means for causing a computer to effect generating further comprises:
computer readable program code means for causing a computer to generate a plurality of check bits associated with the data word according to the H-matrix; and
computer readable program code means for causing a computer to generate a syndrome according to the H-matrix, said syndrome being associated with the data word and comprising a plurality of syndrome bits.

49. The article of manufacture claim 48, wherein each check bit of said plurality of check bits is generated by performing an exclusive OR function or exclusive NOR function on a distinct group of bits of said data word selected according to said H-matrix.

50. The article of manufacture claim 49, wherein said syndrome bits are generated by performing an exclusive OR function or exclusive NOR function on each said check bit and said distinct group of bits of said data word used to generate said particular check bit.

51. The article of manufacture claim 48, wherein each syndrome bit of said syndrome corresponds to a distinct check bit.

52. The article of manufacture claim 48, wherein said computer readable program code means for causing a computer to detect comprises decoding said syndrome to detect any errors in the data word.

53. The article of manufacture claim 52, wherein each syndrome bit comprises an error state and an error-free state, and said computer readable program code means for causing a computer to decode further comprises:
computer readable program code means for causing a computer to indicate no error if each syndrome bit is in its error-free state.

54. The article of manufacture of claim 53, further comprising:
computer readable program code means for causing a computer to compare, if any of said syndrome bits is in its error state, said syndrome with a syndrome decoder table generated according to the H-matrix to detect any single symbol errors, any double symbol errors, and multiple symbol errors in the data word.

55. The article of manufacture of claim 54, wherein said syndrome decoder table comprises a plurality of columns, each column of said plurality of columns corresponding to a symbol of the data word and comprising three sub-columns, said first sub-column corresponding to a first bit of said symbol, said second sub-column corresponding to a second bit of said symbol, and said third sub-column being the result of an exclusive OR function performed on said first and said second sub-columns of said symbol, said computer readable program code means for causing a computer to compare further comprising:

computer readable program code means for causing a computer to compare said syndrome with said first, second, and third sub-column of each column of said syndrome decoder table, wherein said first bit of said symbol is indicated as being erroneous if said syndrome is equal to the first sub-column, said second bit of said symbol is indicated as being erroneous if said syndrome is equal to the second sub-column, both bits of said symbol are indicated as being erroneous if said syndrome is equal to the third sub-column, and an uncorrectable error is indicated, signifying multiple symbol error, if no matches are made between said syndrome and any of the sub-columns of any of the columns.

56. The article of manufacture of claim 47, wherein said error correction code is used in a computer system for single symbol error correction as well as the multiple symbol error detection.

57. The article of manufacture of claim 47, wherein said data word comprises a plurality of two bit symbols.

58. The article of manufacture of claim 47, further comprising:

computer readable program code means for causing a computer to correct any single symbol errors; and computer readable-program code means for causing a computer to generate an uncorrectable error signal if a multiple symbol error is detected.

59. The article of manufacture of claim 58, wherein said computer readable program code means for causing a computer to correct comprises computer readable program code means for causing a computer to perform an XOR operation on a single bit or all bits in said single symbol.

60. The article of manufacture of claim 47, wherein said plurality of subsets comprises n subsets, wherein $3 \leq n \leq 6$.

61. The article of manufacture of claim 47, wherein said one subset of said plurality of subsets comprises:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix}; \text{ and}$$

said remaining subsets of said plurality of subsets comprises:

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

$$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

$$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix}; \text{ and}$$

$$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix}.$$

62. The article of manufacture of claim 47, wherein said H-matrix is:

$$H = \begin{bmatrix} M_0 & M_0 & M_0 & M_0 & M_0 & V_0 & V_0 & \\ M_1 & M_5 & M_4 & M_3 & M_2 & V_0 & V_0 & \\ M_2 & M_1 & M_5 & M_4 & M_3 & V_0 & V_1 & I_{12} \\ M_3 & M_2 & M_1 & M_5 & M_4 & V_0 & V_1 & \\ M_4 & M_3 & M_2 & M_1 & M_5 & V_1 & V_0 & \\ M_5 & M_4 & M_3 & M_2 & M_1 & V_1 & V_0 & \end{bmatrix}.$$

63. The article of manufacture of claim 62, wherein:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix};$$

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

$$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

$$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix};$$

$$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix};$$

$$V_0 = \begin{bmatrix} 10 \\ 01 \end{bmatrix};$$

$$V_1 = \begin{bmatrix} 01 \\ 11 \end{bmatrix}; \quad \text{and}$$

$$I_{12} = \begin{bmatrix} 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 1 \end{bmatrix}.$$

64. The article of manufacture of claim 47 wherein, said H-matrix is:

$$H = \begin{bmatrix} M_0 & V_0 & M_0 & V_0 & M_0 & V_0 & M_0 & V_0 & M_0 & V_0 & \\ M_1 & V_0 & M_5 & V_1 & M_4 & V_1 & M_3 & V_0 & M_2 & V_0 & \\ M_2 & V_0 & M_1 & V_0 & M_5 & V_1 & M_4 & V_1 & M_3 & V_0 & I_{12} \\ M_3 & V_0 & M_2 & V_0 & M_1 & V_0 & M_5 & V_1 & M_4 & V_1 & \\ M_4 & V_1 & M_3 & V_0 & M_2 & V_0 & M_1 & V_0 & M_5 & V_1 & \\ M_5 & V_1 & M_4 & V_1 & M_3 & V_0 & M_2 & V_0 & M_1 & V_0 & \end{bmatrix}.$$

65. The article of manufacture of claim 64, wherein:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix};$$

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

$$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

$$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix};$$

$$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix};$$

$$V_0 = \begin{bmatrix} 10 \\ 01 \end{bmatrix};$$

$$V_1 = \begin{bmatrix} 01 \\ 11 \end{bmatrix}; \quad \text{and}$$

$$I_{12} = \begin{bmatrix} 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 1 \end{bmatrix}.$$

66. The article of manufacture of claim 47, wherein said H-matrix is:

$$H = \begin{bmatrix} M_0 & V_0 & V_0 & M_0 & V_0 & V_0 & M_0 & V_0 & V_0 & M_0 & V_0 & V_0 & M_0 & V_0 & V_0 \\ M_1 & V_0 & V_0 & M_5 & V_1 & V_2 & M_4 & V_1 & V_2 & M_3 & V_0 & V_0 & M_2 & V_0 & V_1 \\ M_2 & V_0 & V_1 & M_1 & V_0 & V_0 & M_5 & V_1 & V_2 & M_4 & V_1 & V_2 & M_3 & V_0 & V_0 & I_{12} \\ M_3 & V_0 & V_0 & M_2 & V_0 & V_1 & M_1 & V_0 & V_0 & M_5 & V_1 & V_2 & M_4 & V_1 & V_2 \\ M_4 & V_1 & V_2 & M_3 & V_0 & V_0 & M_2 & V_0 & V_1 & M_1 & V_0 & V_0 & M_5 & V_1 & V_2 \\ M_5 & V_1 & V_2 & M_4 & V_1 & V_2 & M_3 & V_0 & V_0 & M_2 & V_0 & V_1 & M_1 & V_0 & V_0 \end{bmatrix}.$$

67. The article of manufacture of claim 66, wherein:

$$M_0 = \begin{bmatrix} 00 & 00 & 00 & 00 & 00 & 10 & 10 & 10 & 10 & 10 & 10 & 10 & 10 \\ 00 & 00 & 00 & 00 & 00 & 01 & 01 & 01 & 01 & 01 & 01 & 01 & 01 \end{bmatrix};$$

$$M_1 = \begin{bmatrix} 00 & 10 & 11 & 11 & 01 & 00 & 00 & 10 & 01 & 00 & 11 & 01 & 00 \\ 00 & 01 & 10 & 10 & 11 & 00 & 00 & 01 & 11 & 00 & 10 & 11 & 00 \end{bmatrix};$$

$$M_2 = \begin{bmatrix} 00 & 00 & 00 & 01 & 10 & 10 & 11 & 00 & 00 & 01 & 10 & 10 & 11 \\ 00 & 00 & 00 & 11 & 01 & 01 & 10 & 00 & 00 & 11 & 01 & 01 & 10 \end{bmatrix};$$

$$M_3 = \begin{bmatrix} 10 & 10 & 00 & 10 & 10 & 10 & 00 & 11 & 10 & 00 & 00 & 00 & 10 \\ 01 & 01 & 00 & 01 & 01 & 01 & 00 & 10 & 01 & 00 & 00 & 00 & 01 \end{bmatrix};$$

$$M_4 = \begin{bmatrix} 10 & 00 & 10 & 00 & 10 & 00 & 10 & 00 & 11 & 11 & 10 & 10 & 10 \\ 01 & 00 & 01 & 00 & 01 & 00 & 01 & 00 & 10 & 10 & 01 & 01 & 01 \end{bmatrix};$$

-continued $$M_5 = \begin{bmatrix} 10 & 10 & 01 & 00 & 10 & 00 & 00 & 00 & 00 & 10 & 01 & 11 & 11 \\ 01 & 01 & 11 & 00 & 01 & 00 & 00 & 00 & 00 & 01 & 11 & 10 & 10 \end{bmatrix};$$

$$V_0 = \begin{bmatrix} 10 \\ 01 \end{bmatrix};$$

$$V_1 \begin{bmatrix} 01 \\ 11 \end{bmatrix};$$

$$V_2 = \begin{bmatrix} 11 \\ 10 \end{bmatrix}; \quad \text{and}$$

$$I_{12} = \begin{bmatrix} 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 1 \end{bmatrix}.$$

68. The article of manufacture of claim 47, wherein any row of said plurality of rows is interchangeable with any other row of said plurality of rows.

69. The article of manufacture of claim 47, wherein any column of said plurality of columns is interchangeable with any other column of said plurality of columns.

70. A system of correcting symbol errors in a data word, comprising:

a symbol error correction code generating device adapted to generate a symbol error correction code according to an H-matrix comprising a plurality of subsets arranged in a plurality of rows and columns, wherein each of at least one row of said plurality of rows comprises, in part, multiple iterations of one subset of said plurality of subsets, and a remainder of said plurality of rows comprises, in part, a cyclic permutation of all remaining subsets of said plurality of subsets; and a symbol error detecting device adapted to detect symbol errors in the data word according to said symbol error correction code, wherein the symbol error detecting device is further adapted to detect multiple symbol errors in the data word using the symbol error correction code.

* * * * *